United States Patent
Kim et al.

(10) Patent No.: US 10,826,732 B2
(45) Date of Patent: Nov. 3, 2020

(54) METHOD AND APPARATUS FOR CONTROLLING SPECTRAL REGROWTH

(71) Applicant: SAMSUNG ELECTRONICS CO., LTD., Suwon-si (KR)

(72) Inventors: Daeyoung Kim, Suwon-si (KR); Changhyun Baek, Suwon-si (KR); Youngik Cho, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/593,480

(22) Filed: Oct. 4, 2019

(65) Prior Publication Data

US 2020/0169436 A1    May 28, 2020

(30) Foreign Application Priority Data

Nov. 27, 2018 (KR) .................. 10-2018-0148865
Apr. 4, 2019 (KR) .................. 10-2019-0039745

(51) Int. Cl.
| | | |
|---|---|---|
| *H04K 1/02* | (2006.01) | |
| *H04L 25/03* | (2006.01) | |
| *H04L 25/49* | (2006.01) | |
| *H04L 25/08* | (2006.01) | |
| *H04L 27/36* | (2006.01) | |
| *H03F 3/21* | (2006.01) | |
| *H03F 1/32* | (2006.01) | |

(Continued)

(52) U.S. Cl.
CPC .......... *H04L 25/08* (2013.01); *H03F 1/0205* (2013.01); *H03F 1/3247* (2013.01); *H03F 3/19* (2013.01); *H03F 3/21* (2013.01); *H04L 27/368* (2013.01)

(58) Field of Classification Search
CPC ......... H04L 25/08; H04L 27/368; H03F 3/21; H03F 1/3247; H03F 3/19; H03F 1/0205; H04W 52/0209; H04W 72/04
USPC ................................. 375/297, 296, 300, 268
See application file for complete search history.

(56) References Cited

U.S. PATENT DOCUMENTS

| 8,873,677 B1 | 10/2014 | Loh et al. |
| 8,908,797 B2 | 12/2014 | Jeckeln |
| 8,942,313 B2 | 1/2015 | Khlat et al. |

(Continued)

OTHER PUBLICATIONS

Joel H. K. Vuolevi, et al., "Measurement Technique for Characterizing Memory Effects in RF Power Amplifiers," IEEE Transactions on Microwave Theory and Techniques, vol. 49, No. 8 Aug. 2001.

(Continued)

*Primary Examiner* — Phuong Phu
(74) *Attorney, Agent, or Firm* — F. Chau & Associates, LCC

(57) ABSTRACT

A device for controlling spectral regrowth includes a transmission signal processor configured to generate a baseband transmission signal and a controller. The controller is configured to adjust delay of an envelope tracking path that provides a supply voltage to an envelope tracking power amplifier included in a transmission path that generates a radio frequency (RF) transmission signal from the baseband transmission signal. The controller may obtain allocation information of resource blocks included in the RF transmission signal from the transmission signal processor and may determine the delay of the envelope tracking path based on the allocation information.

18 Claims, 13 Drawing Sheets

(51) Int. Cl.
H03F 3/19 (2006.01)
H03F 1/02 (2006.01)

(56) References Cited

U.S. PATENT DOCUMENTS

| | | |
|---|---|---|
| 9,055,529 B2 * | 6/2015 | Shih .................. H04W 52/0209 |
| 9,166,830 B2 | 10/2015 | Camuffo et al. |
| 9,225,308 B2 | 12/2015 | Langer et al. |
| 10,056,863 B2 | 8/2018 | Loeffler |
| 2014/0135050 A1 * | 5/2014 | Goedken ............... H04W 72/04 |
| | | 455/509 |
| 2017/0170791 A1 | 6/2017 | Watkins et al. |

OTHER PUBLICATIONS

Junhyung Jeong, et al., "Time Mismatch Effect in Linearity of Hybrid Envelope Tracking Power Amplifier," IEEE Microwave and Wireless Components Letters, vol. 25, No. 8, Aug. 2015.

* cited by examiner

METHOD AND APPARATUS FOR CONTROLLING SPECTRAL REGROWTH

CROSS-REFERENCE TO RELATED APPLICATIONS

This application claims the benefit of, and priority to, Korean Patent Application No. 10-2018-0148865, filed on Nov. 27, 2018 and Korean Patent Application No. 10-2019-0039745, filed on Apr. 4, 2019, in the Korean Intellectual Property Office, the disclosures of which are incorporated by reference herein in their entirety.

TECHNICAL FIELD

The present application relates to wireless communication, and more particularly, to a method and an apparatus for controlling spectral regrowth.

DISCUSSION OF THE RELATED ART

In the wireless transmission of data, spectral regrowth may refer to a phenomenon in which signal power increases outside of a particular frequency band. To ensure high quality wireless connections, spectral regrowth may be suppressed. The spectral regrowth may increase as transmission power increases. Therefore, it might not be easy to suppress the spectral regrowth while satisfying the maximum power requirement defined by a wireless communication system. In particular, it might not be easy and it might be expensive to design a power amplifier that suppresses spectral regrowth while satisfying the maximum power requirement in a wide bandwidth.

SUMMARY

According to an aspect of the inventive concept, there is provided a device for controlling spectral regrowth. The device includes a transmission signal processor configured to generate a baseband transmission signal and a controller. The controller is configured to adjust a delay of an envelope tracking path that provides a supply voltage to an envelope tracking power amplifier included in a transmission path that generates a radio frequency (RF) transmission signal from the baseband transmission signal. The controller may obtain allocation information of resource blocks included in the RF transmission signal from the transmission signal processor and may determine the delay of the envelope tracking path based on the allocation information.

According to an aspect of the inventive concept, there is provided a device for controlling spectral regrowth. The device includes a transmission signal processor configured to generate a baseband transmission signal and a controller. The controller is configured to adjust a delay of an envelope tracking path that provides a supply voltage to an envelope tracking power amplifier included in a transmission path that generates an RF transmission signal from the baseband transmission signal. The controller may obtain an adjacent channel leakage ratio (ACLR) measurement information by measuring an ACLR of a channel band of the RF transmission signal and may adjust the delay of the envelope tracking path based on the ACLR measurement information.

According to an aspect of the inventive concept, there is provided a device for controlling spectral regrowth. The device includes a transmission signal processor configured to generate a baseband transmission signal and a controller. The controller is configured to adjust a delay of an envelope tracking path that provides a supply voltage to an envelope tracking power amplifier included in a transmission path that generates an RF transmission signal from the baseband transmission signal. The controller may determine the delay of the envelope tracking path such that an upper ACLR and a lower ACLR of the RF transmission signal are asymmetrically generated.

BRIEF DESCRIPTION OF THE DRAWINGS

A more complete appreciation of the present disclosure and many of the attendant aspects thereof will be more clearly understood from the following detailed description taken in conjunction with the accompanying drawings, in which.

DETAILED DESCRIPTION OF THE EMBODIMENTS

Figure 1:
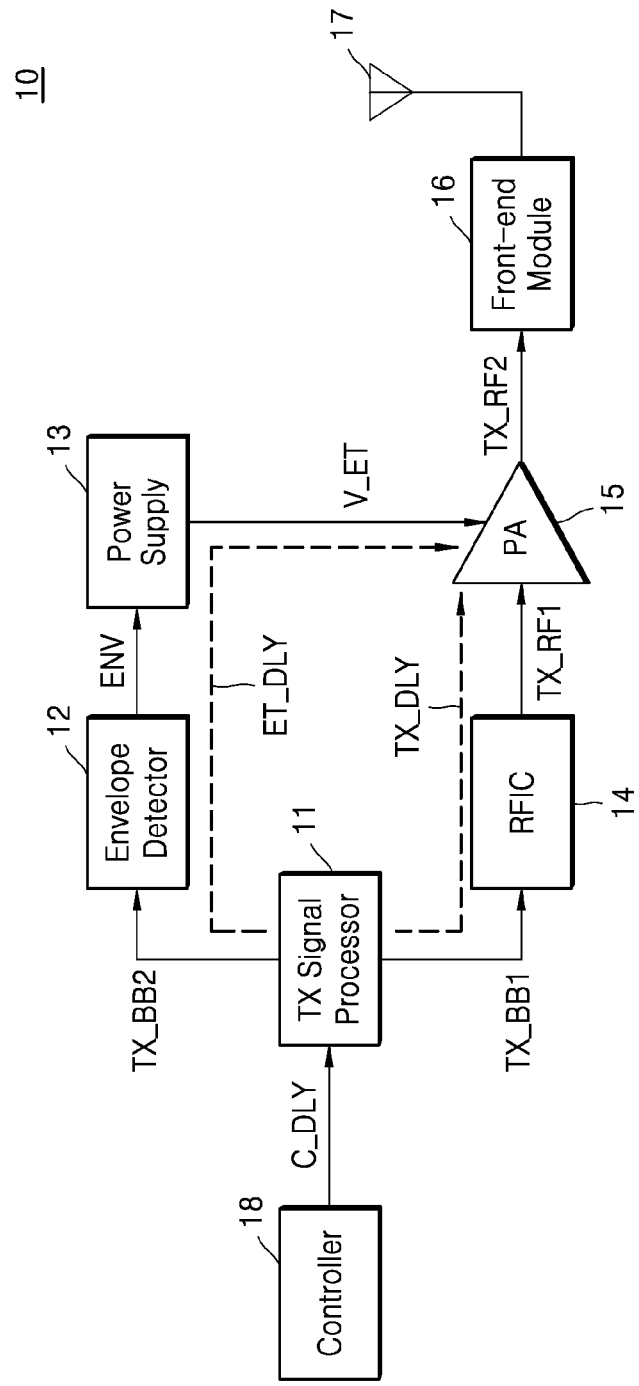
FIG. 1 is a block diagram schematically illustrating a wireless communication device according to an exemplary embodiment of the inventive concept.

In describing exemplary embodiments of the present disclosure illustrated in the drawings, specific terminology is employed for sake of clarity. However, the present disclosure is not intended to be limited to the specific terminology so selected, and it is to be understood that each specific element includes all technical equivalents which operate in a similar manner.

FIG. 1 is a block diagram schematically illustrating a wireless communication device 10 according to an exemplary embodiment of the inventive concept. As illustrated in FIG. 1, the wireless communication device 10 may include a transmission signal processor 11, an envelope detector 12, a power supply 13, a radio frequency integrated circuit (RFIC) 14, a power amplifier 15, a front-end module 16, an antenna 17, and a controller 18. In some embodiments, the transmission signal processor 11, the envelope detector 12, the front-end module 16, and the controller 18 may each be embodied as an integrated circuit. In some embodiments, the power supply 13 may be embodied as a transformer coupled to specialized circuitry for maintaining a desired voltage. In some embodiments, the power amplifier 15 may be embodied as an operational amplifier. In some embodiments, the antenna 17 may be embodied as a conductive element of a desired shape and size. In some embodiments, the wireless communication device 10 may further include elements that are not illustrated in FIG. 1. For example, a switch and/or a duplexer controlled according to a transmission mode or a reception mode may be disposed between the power amplifier 15 and the front-end module 16.

The wireless communication device 10 may be connected to a wireless communication system by transmitting and receiving a signal through the antenna 17. The wireless communication system, to which the wireless communication device 10 is capable of being connected, may be referred to as radio access technology (RAT). As a non-limiting example, the wireless communication system may be a wireless communication system using a cellular network such as a $5^{th}$ generation wireless (5G) system, a long term evolution (LTE) system, an LTE-advanced system, a code division multiple access (CDMA) system, a global system for mobile communication (GSM) system, or a wireless local area network (WLAN) system or another arbitrary wireless communication system. Hereinafter, it is assumed that the wireless communication system to which the wireless communication device 10 is connected is a wireless communication system using a cellular network. However, it will be understood that exemplary embodiments of the inventive concept are not limited thereto.

The wireless communication network of the wireless communication system may support a plurality of wireless communication devices, including the wireless communication device 10 illustrated in FIG. 1 to communicate with each other by sharing available network resources. For example, in the wireless communication network, information may be transmitted by a varying multiple connection method such as code division multiple access (CDMA), frequency division multiple access (FDMA), time division multiple access (TDMA), orthogonal frequency division multiple access (OFDMA), single carrier frequency division multiple access (SCFDMA), OFDM-FDMA, OFDM-TDMA, and/or OFDM-CDMA.

The wireless communication device 10 may refer to an arbitrary device that is connected to the wireless communication system. A base station (BS) as an example of the wireless communication device 10 may commonly refer to a fixed station that communicates with a user device and/or another BS and may exchange data and control information by communicating with the user device and/or the other BS. For example, the BS may be referred to as a node B, an evolved-node B (eNB), a next generation node B (gNB), a sector, a site, a base transceiver system (BTS), an access point (AP), a relay node, a remote radio head (RRH), a radio unit (RU), and/or a small cell. In the current specification, the BS or the cell may be interpreted as a function of or a partial region covered by a base station controller (BSC) in CDMA, the node-B in wideband CDMA (WCDMA), the eNB in LTE, or the sector (the site) and may include various coverage regions such as mega-cell, macro-cell, microcell, pico-cell, pemto-cell, relay node, RRH, RU, and small cell communication ranges.

As an example of the wireless communication device 10, user equipment (UE) may refer to an arbitrary device that may be fixed or may be mobile and that communicates with the BS and may transmit and receive data and/or control information. For example, the UE may be referred to as terminal equipment, a mobile station (MS), a mobile terminal (MT), a user terminal (UT), a subscriber station (SS), a wireless device, and/or a handheld device. In the current specification, it is assumed that the wireless communication device 10 is UE. However, it will be understood that exemplary embodiments of the inventive concept are not limited thereto.

Referring to FIG. 1, the antenna 17 may be connected to the front-end module 16 and may transmit a signal provided by the front-end module 16 to another wireless communication device or may provide a signal received from the other wireless communication device to the front-end module 16. In FIG. 1, some elements used for receiving the signal from the other wireless communication device through the antenna 17 might not be shown. In some embodiments, the wireless communication device 10 may include a plurality of antennas for a phased array and multiple-input and multiple-output (MIMO).

The transmission signal processor 11 may generate a baseband signal including information to be transmitted through the antenna 17. In some embodiments, the transmission signal processor 11 may include an encoder, a modulator, a filter, and a digital-to-analog converter (DAC). For example, as illustrated in FIG. 1, the transmission signal processor 11 may generate a first baseband transmission signal TX_BB1 and may provide the first baseband transmission signal TX_BB1 to the RFIC 14. In addition, the transmission signal processor 11 may generate a second baseband transmission signal TX_BB2 and may provide the second baseband transmission signal TX_BB2 to the envelope detector 12. A second radio frequency (RF) transmission signal TXRF2 may be generated from the first baseband transmission signal TX_BB1, and the second RF transmission signal TX_RF2 may be transmitted to the front-end module 16, wherein the second baseband transmission signal TX_BB2 may be used for generating a supply voltage V_ET of the power amplifier 15. The transmission signal processor 11 may receive a delay control signal C_DLY from the controller 18 and may adjust delay of the second baseband transmission signal TX_BB2 in response to the delay control signal C_DLY. In the current specification, the first baseband transmission signal TX_BB1 and the second baseband transmission signal TX_BB2 may be collectively referred to as a baseband transmission signal.

The envelope detector 12 may receive the second baseband transmission signal TX_BB2 from the transmission signal processor 11 and may detect an envelope from the second baseband transmission signal TX_BB2. The envelope detector 12 may provide an envelope signal ENV to the power supply 13. The power supply 13 may provide the supply voltage V_ET having a magnitude following that of the envelope signal ENV to the power amplifier 15. A path in which the supply voltage V_ET of the power amplifier 15 is generated from the second baseband transmission signal TX_BB2 may be referred to as an envelope tracking path, and the envelope tracking path may include the envelope detector 12 and the power supply 13. As illustrated in FIG. 1, delay ET_DLY of the envelope tracking path may occur from the transmission signal processor 11 to the power amplifier 15 through the envelope detector 12 and the power supply 13. In the current specification, the power amplifier 15 for receiving the supply voltage V_ET that changes in accordance with the envelope may be referred to as an envelope tracking power amplifier.

The RFIC 14 may receive the first baseband transmission signal TX_BB1 from the transmission signal processor 11 and may generate a first RF transmission signal TX_RF1 from the first baseband transmission signal TX_BB1. For example, the RFIC 14 may include a mixer, a filter, and an amplifier. The power amplifier 15 may generate a second RF transmission signal TX_RF2 by amplifying the first RF transmission signal TX_RF1 by using power provided by the supply voltage V_ET. A path in which the first RF transmission signal TX_RF1 is generated from the first baseband transmission signal TX_BB1 may be referred to as a transmission path, and the transmission path may include the RFIC 14. As illustrated in FIG. 1, delay TX_DLY of the transmission path may occur from the transmission signal processor 11 to the power amplifier 15 through the RFIC 14.

Due to non-linearity of input and output power of the power amplifier 15, spectral regrowth may increase at high input power and interference with an adjacent channel may occur at high input power. The spectral regrowth may increase as transmission power and a modulation order increase and as a signal bandwidth is reduced. The wireless communication system to which the wireless communication device 10 is connected restricts the spectral regrowth by a metric such as an adjacent channel leakage ratio (ACLR) or an adjacent channel power ratio (ACPR) to prevent interference with an adjacent channel. Therefore, the power amplifier 15 may be required to satisfy an ACLR or an ACPR requirement as well as the maximum power requirement. On the other hand, digital pre-distortion (DPD) may be considered in order to reduce the spectral regrowth. However, the DPD may be applied to a power amplifier having sufficient saturation power. A high-power user equipment (HPUE) power amplifier or a wideband power amplifier having high saturation power might not be easily designed and might be expensive to design, in terms of, for example, an area, an exothermic, and power consumption. In order to relax requirements for the power amplifier 15, the wireless communication system may define the maximum power requirement relaxed in accordance with a condition. For example, the following [TABLE 1] represents examples of maximum power reduction (MPR) defined in accordance with a channel bandwidth and the modulation order in the wireless communication system.

However, as described later with reference to FIG. 2, when the number of resource blocks (RB) allocated in a channel band CB is small, MPR requirement or additional MPR (A-MPR) requirement of [TABLE 1] might not be applied. Hereinafter, as the metric of the spectral regrowth, the ACLR will be mainly referred to. However, it will be understood that other metrics that represent the spectral regrowth are available.

The controller 18 may control the spectral regrowth by using a characteristic in which symmetry of the ACLR changes in accordance with the delay ET_DLY of the envelope tracking path. Therefore, requirements defined by the wireless communication system may be easily satisfied and the use of a high performance device, for example, a high performance power amplifier, may be omitted. As a result, the wireless communication device 10 of low expenses may be obtained. In addition, in some embodiments, the spectral regrowth may be controlled in accordance with a transmission parameter. Therefore, interference with an adjacent channel may be effectively reduced.

In some embodiments, unlike what is shown in FIG. 1, the envelope detector 12 may commonly receive a signal that is the same as the signal received by the RFIC 14 from the transmission signal processor 11, for example, the first baseband transmission signal TX_BB1, and may generate the envelope signal ENV by detecting the envelope from the first baseband transmission signal TX_BB1. As described above, when the envelope detector 12 receives the first baseband transmission signal TX_BB1 together with the RFIC 14, the controller 18 may provide the delay control signal C_DLY to the envelope detector 12 and the envelope detector 12 may generate the envelope signal ENV delayed in accordance with the delay control signal C_DLY.

Figure 2:
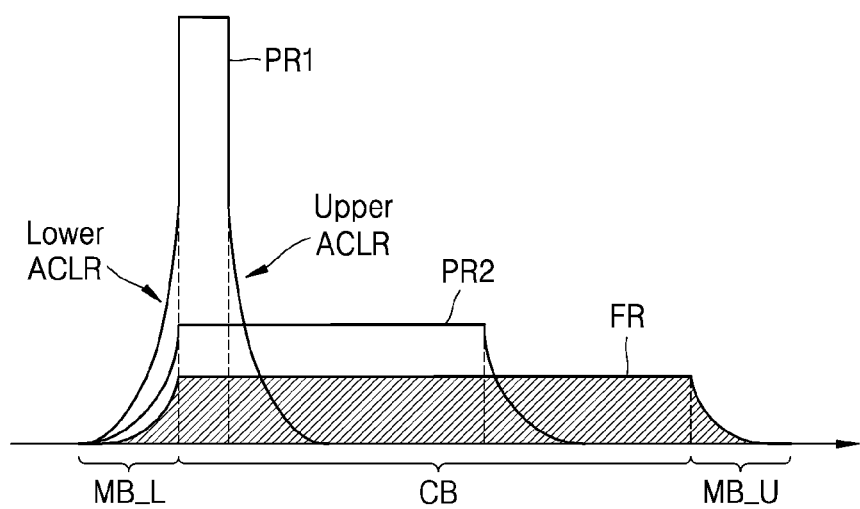
FIG. 2 is a graph illustrating examples of a frequency spectrum of transmission power according to an exemplary embodiment of the inventive concept.

FIG. 2 is a graph illustrating examples of a frequency spectrum of transmission power according to an exemplary embodiment of the inventive concept. For example, FIG. 2 illustrates a case FR in which full resource blocks are allocated in the channel band CB and cases PR1 and PR2 in which partial resource blocks are allocated in the channel band CB.

When the number of resource blocks allocated in the channel band CB is small, the transmission power may be concentrated on the allocated resource blocks. Therefore, the spectral regrowth may increase. For example, as illustrated in FIG. 2, in the case FR in which the full resource blocks are allocated in the channel band CB, the spectral regrowth (or the ACLR) may be decreased in the outside of the channel band CB and, in the cases PR1 and PR2 in which the partial resource blocks are allocated in the channel band CB, the spectral regrowth (or the ACLR) may increase in the outside of the channel band CB. In addition, as illustrated in FIG. 2, in the cases PR1 and PR2 in which the partial resource blocks are allocated in the channel band CB, more spectral regrowth may occur in the case PR1 in which fewer resource blocks are allocated than in the case PR2 in which a greater number of resource blocks are allocated. In the current specification, as represented in the spectral regrowth of PR1 of FIG. 2, the spectral regrowth corresponding to a

TABLE 1

| | Channel bandwidth/Transmission bandwidth configuration [RB] | | | | | | MPB |
|---|---|---|---|---|---|---|---|
| Modulation | 1.4 MHz | 3.0 MHz | 5 MHz | 10 MHz | 15 MHz | 20 MHz | (dB) |
| QPSK | >5 | >4 | >8 | >12 | >16 | >18 | ≤1 |
| 16 QAM | ≤5 | ≤4 | ≤8 | ≤12 | ≤16 | ≤18 | ≤1 |
| 16 QAM | >5 | >4 | >8 | >12 | >16 | >18 | ≤2 | low frequency of a signal band, for example, a band to which the resource blocks are allocated, may be referred to as a lower ACLR (or lower spectral regrowth) and the spectral regrowth corresponding to a high frequency may be referred to as an upper ACLR (or upper spectral regrowth). In addition, bands MB_L and MB_U, in which the spectral regrowth occurs to be adjacent to the channel band CB to which the resource blocks are allocated, may be referred to as a lower ACLR measurement band (or a lower spectral regrowth measurement band) and an upper ACLR measurement band (or an upper spectral regrowth measurement band) or may be collectively referred to as an ACLR measurement band. As illustrated in FIG. 2, in the cases PR1 and PR2 in which the partial resource blocks are allocated, it may be required to restrict the lower ACLR related to the lower ACLR measurement band MB_L. Since the upper ACLR is spaced apart from the upper ACLR measurement band MB_U, the upper ACLR might not cause interference with an adjacent channel.

Figure 3A:
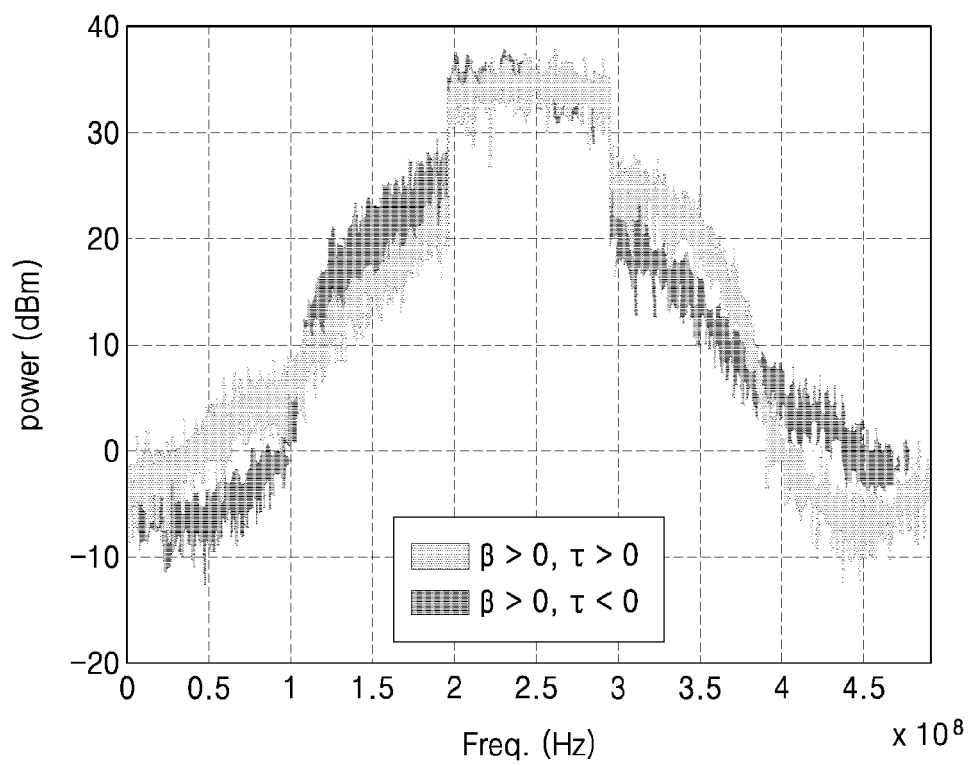
FIGS. 3A and 3B are graphs illustrating a change in spectral regrowth in accordance with a delay of an envelope tracking path according to exemplary embodiments of the inventive concept.
Figure 3B:
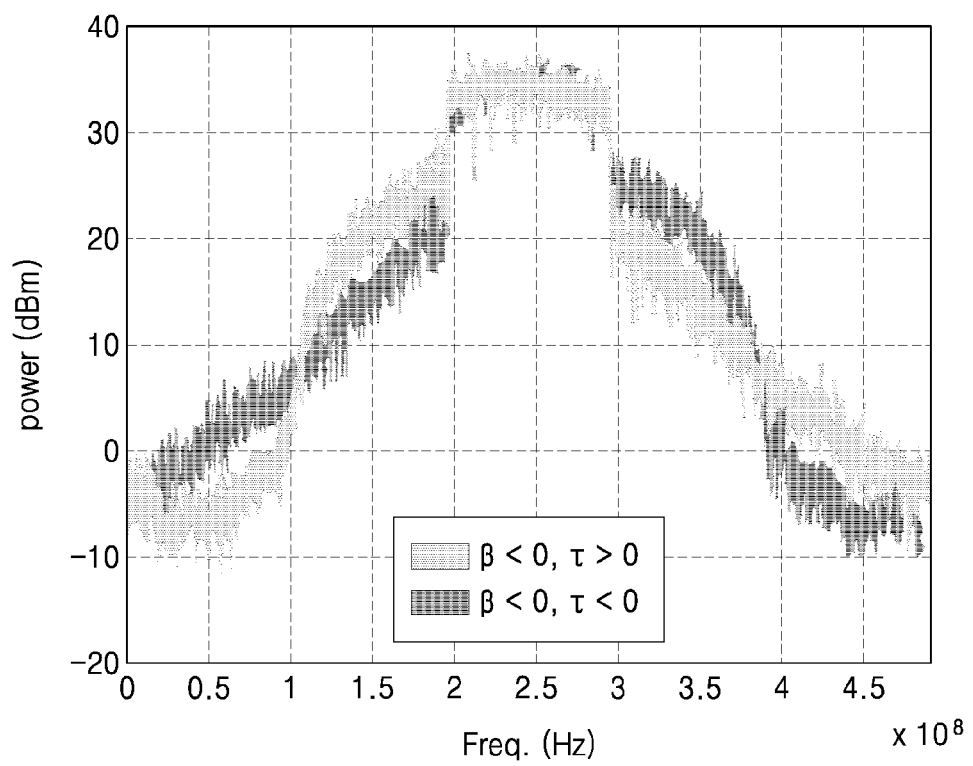

FIGS. 3A and 3B are graphs illustrating a change in spectral regrowth in accordance with delay of an envelope tracking path according to exemplary embodiments of the inventive concept. For example, the graphs of FIGS. 3A and 3B represent results of simulating the spectral regrowth by passing a 5G NR 100 MHz signal through a model of a power amplifier, which is described later. Hereinafter, FIGS. 3A and 3B will be described with reference to FIG. 1.

The spectral regrowth may unsymmetrically change in accordance with a change in delay ET_DLY of the envelope tracking path due to an AMPM characteristic of the power amplifier 15. For example, in accordance with a difference between the delay TX_DLY of the transmission path and the delay ET_DLY of the envelope tracking path, the upper ACLR and the lower ACLR may unsymmetrically change. Asymmetry of the ACLR in accordance with the delay ET_DLY of the envelope tracking path may be simulated by modeling a power amplifier PA. The following [EQUATION 1] represents an AMAM model of the envelope tracking system defined by using a Cann model for modeling a non-linear input and output transfer characteristic.

$$AMAM(|x(t)|) = \frac{g(V_{DD})|x(t)|}{\left(1+\left(\frac{g(V_{DD})|x(t)|}{L(V_{DD})}\right)^{S(V_{DD})}\right)^{\frac{1}{S(V_{DD})}}}$$ [EQUATION 1]

$$V_{DD} = V_{min} + k|x(t-\tau)|$$

In [EQUATION 1], $V_{DD}$ is a drain voltage, g is a small signal gain, S is a knee sharpness, and L is a saturation level. $V_{min}$ is a bias of the power supply 13, k is a gain of the power supply 13, and τ may be a difference between the delay ET_DLY of the envelope tracking path and the delay TX_DLY of the transmission path. When it is assumed that the power amplifier 15 operates in a linear region, $g(V_{DD})|x(t)|\ll L(V_{DD})$ and the AMAM model may be simply expressed as in the following [EQUATION 2].

$$AMAM(|x(t)|)=g(V_{DD})|x(t)|$$ [EQUATION 2]

In [EQUATION 2], assuming that a change in small signal gain due to $V_{DD}$ has a uniform gain, the AMAM model may be simply expressed again as in the following [EQUATION 3].

$$AMAM(|x(t)|)=A(V_{min}+k|x(t-\tau)|)|x(t)|$$ [EQUATION 3]

In addition, an AMPM model of the power amplifier 15 may be expressed as in the following [EQUATION 4].

$$AMPM(|x(t)|)=\beta|x(t)|$$ [EQUATION 4]

In [EQUATION 4], β may be a value dependent on the power amplifier 15. An output signal (for example, TX_RF2 of FIG. 1) of the power amplifier 15 may be represented by the following [EQUATION 5] by applying the AMAM model of [EQUATION 3] and the AMPM model of [EQUATION 4].

$$y(t) = AMAM(|x(t)|)e^{j(\angle x(t)+AMPM(|x(t)|))} =$$ [EQUATION 5]
$$A(V_{min}+k|x(t-\tau)|)|x(t)|e^{j\angle x(t)}e^{j\beta|x(t)|} =$$
$$A(V_{min}+k|x(t-\tau)|)x(t)e^{j\beta|x(t)|}$$

Referring to FIG. 3A, in [EQUATION 5], when β>0, τ>0 is satisfied, the upper spectral regrowth may increase and the lower spectral regrowth may be decreased. In addition, when β>0, τ<0 is satisfied, the lower spectral regrowth may increase and the upper spectral regrowth may be decreased. Referring to FIG. 3B, when β<0, τ>0 is satisfied, the lower spectral regrowth may increase and the upper spectral regrowth may be decreased. When β<0, τ<0 is satisfied, the upper spectral regrowth may increase and the lower spectral regrowth may be decreased.

Figure 4:
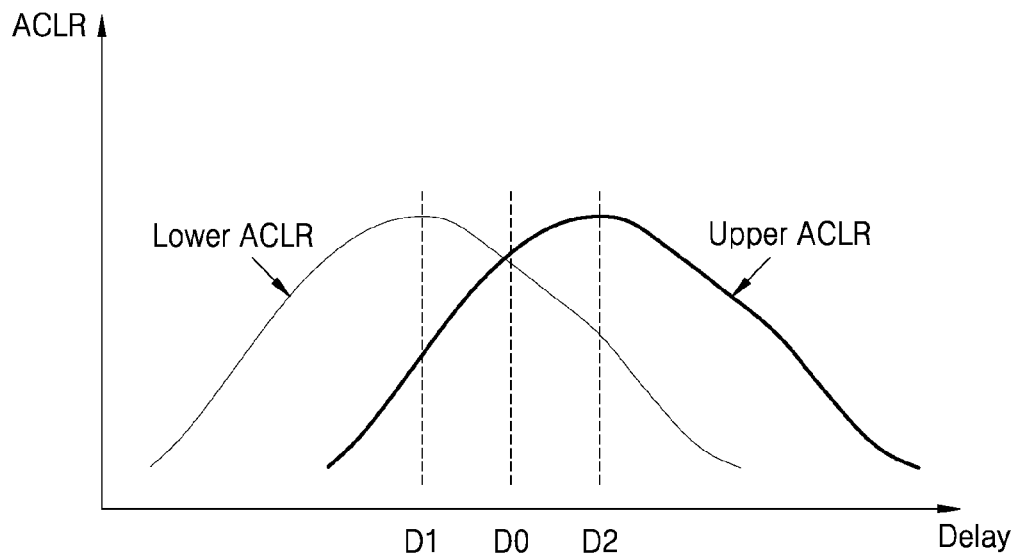
FIG. 4 is a graph illustrating a change in spectral regrowth in accordance with a delay of an envelope tracking path according to an exemplary embodiment of the inventive concept.

FIG. 4 is a graph illustrating a change in spectral regrowth in accordance with delay of an envelope tracking path according to an exemplary embodiment of the inventive concept. For example, the graphs of FIG. 4 illustrate the upper ACLR and the lower ACLR in accordance with the delay of the envelope tracking path. Hereinafter, FIG. 4 will be described with reference to FIG. 1.

As described above with reference to FIGS. 3A and 3B, the spectral regrowth may asymmetrically change in accordance with the delay of the envelope tracking path. As one of the metrics of the spectral regrowth, an ACLR may be represented by the following [EQUATION 6].

$$ACLR(dBc) = \frac{\text{adjacent channel power}}{\text{main channel power}}$$ [EQUATION 6]

Referring to FIG. 4, when the delay ET_DLY of the envelope tracking path is 'D0', the delay ET_DLY of the envelope tracking path may coincide with the delay TX_DLY of the transmission path. Therefore, the upper ACLR may coincide with the lower ACLR. As a result, symmetrical spectral regrowth may occur. On the other hand, when the delay ET_DLY of the envelope tracking path is 'D2', (for example, τ>0) the upper ACLR may increase and the lower ACLR may be decreased. In addition, when the delay ET_DLY of the envelope tracking path is 'D1', (for example, τ<0) the lower ACLR may increase and the upper ACLR may be decreased. As illustrated in FIG. 4, when the delay ET_DLY of the envelope tracking path is less than 'D1' or greater than 'D2', both the upper ACLR and the lower ACLR may be decreased. However, due to an increased difference between the delay ET_DLY of the envelope tracking path and the delay TX_DLY of the transmission path, another transmission characteristic may deteriorate. For example, an error vector magnitude (EVM) may increase.

The controller 18 may determine the delay ET_DLY of the envelope tracking path by using the above-described asymmetry of the spectral regrowth and may generate the delay control signal C_DLY in accordance with the determined delay ET_DLY of the envelope tracking path. For example, instead of always making the delay ET_DLY of the envelope tracking path coincide with the delay TX_DLY of the transmission path such that the upper ACLR coincides with the lower ACLR, the delay ET_DLY of the envelope tracking path may be controlled so as to satisfy requirements in the upper ACLR measurement band MB_U and the lower ACLR measurement band MB_L of FIG. 2. In some embodiments, the controller 18 may adjust the delay ET_DLY of the envelope tracking path in a range of 'D1' to 'D2' of FIG. 4.

Figure 5:
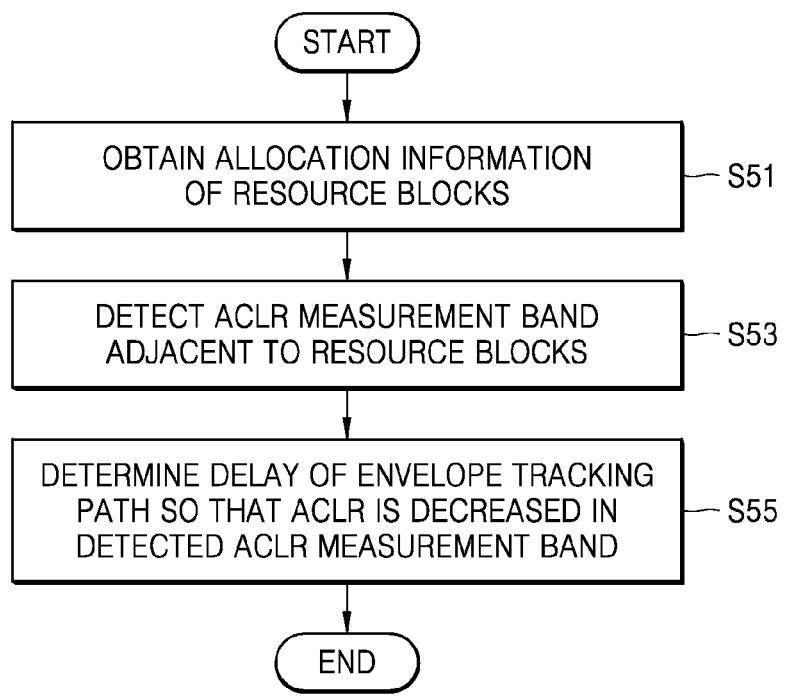
FIG. 5 is a flowchart illustrating a method of controlling spectral regrowth, according to an exemplary embodiment of the inventive concept.

FIG. 5 is a flowchart illustrating a method of controlling spectral regrowth, according to an exemplary embodiment of the inventive concept. For example, the flowchart of FIG. 5 illustrates a method of controlling the spectral regrowth by using allocation information of the resource blocks. In some embodiments, the method of FIG. 5 may be performed by the controller 18 of FIG. 1 and will be described with reference to FIG. 1.

Referring to FIG. 5, an operation of obtaining the allocation information of the resource blocks may be performed in operation S51. For example, the controller 18 may obtain the allocation information of the resource blocks from the transmission signal processor 11 in the channel band CB. As described above with reference to FIG. 2, the spectral regrowth may change in accordance with the number of resource blocks allocated in the channel band CB and positions of the resource blocks. The transmission signal processor 11 may provide the number and offset of resource blocks allocated in the channel band CB to the controller 18 as some of transmission parameters.

In operation S53, an operation of detecting the ACLR measurement band adjacent to the resource blocks may be performed. For example, the controller 18 may detect an edge of the channel band CB adjacent to the allocated resource blocks, for example, the ACLR measurement band, based on the number and offset of allocated resource blocks provided by the transmission signal processor 11. The offset of the resource blocks may represent the positions of the resource blocks allocated in the channel band CB. Therefore, the controller 18 may detect the ACLR measurement band of the channel band CB adjacent to the allocated resource blocks. For example, like in the 'PR1' of FIG. 2, when the partial resource blocks are allocated, the controller 18 may detect the lower ACLR measurement band MB_L of the channel band CB.

In operation S55, an operation of determining the delay ET_DLY of the envelope tracking path such that the ACLR is decreased in the detected ACLR measurement band may be performed. When the lower ACLR measurement band MB_L is detected in operation S53, the controller 18 may determine the delay ET_DLY of the envelope tracking path such that the lower ACLR is decreased. For example, as described above with reference to FIG. 3A, when β>0 is satisfied, the controller 18 may increase the delay ET_DLY of the envelope tracking path and, as described above with reference to FIG. 3B, when β<0 is satisfied, the controller 18 may reduce the delay ET_DLY of the envelope tracking path. On the other hand, when the upper ACLR measurement band MB_U is detected in operation S53, the controller 18 may determine the delay of the envelope tracking path such that the upper ACLR is decreased. For example, as described above with reference to FIG. 3A, when β>0 is satisfied, the controller 18 may reduce the delay ET_DLY of the envelope tracking path and, as described above with reference to FIG. 3B, when β<0 is satisfied, the controller 18 may increase the delay ET_DLY of the envelope tracking path. In order to determine the delay ET_DLY of the envelope tracking path, the controller 18 may use a lookup table as described later with reference to FIG. 10A in some embodiments or may use an artificial neural network as described later with reference to FIG. 10B in some embodiments. Examples in which the ACLR asymmetrically changes in accordance with the determined delay ET_DLY of the envelope tracking path will be described later with reference to FIGS. 6A and 6B.

Figure 6A:
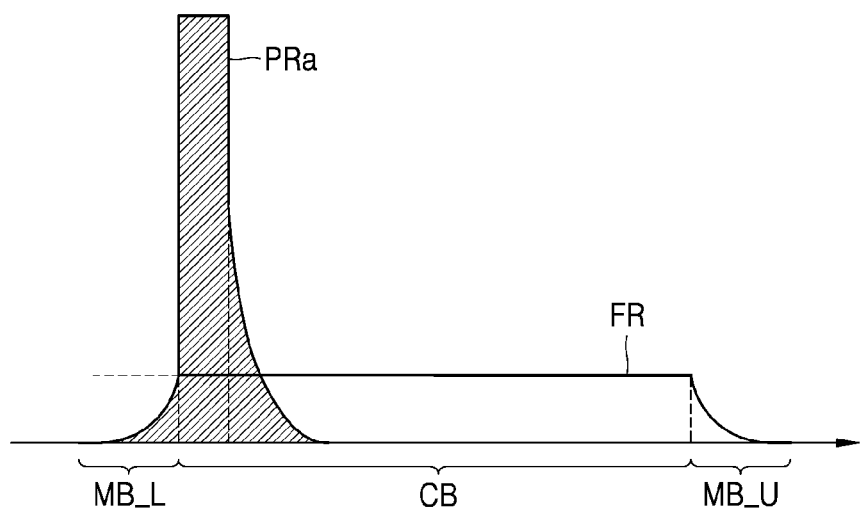
FIGS. 6A and 6B are graphs illustrating examples of a frequency spectrum of transmission power, according to exemplary embodiments of the inventive concept.
Figure 6B:
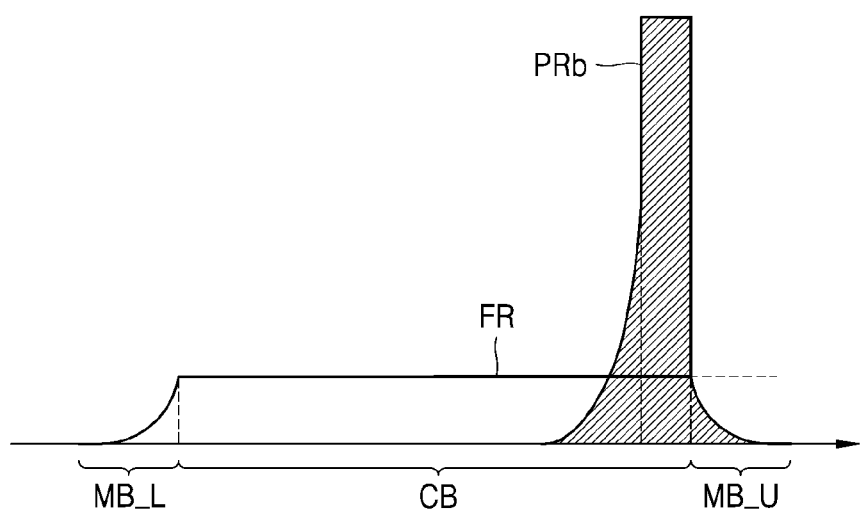

FIGS. 6A and 6B are views illustrating examples of frequency spectrums of transmission power according to exemplary embodiments of the inventive concept. For example, the frequency spectrums of FIGS. 6A and 6B represent the transmission power having the spectral regrowth changed by adjusting the delay ET_DLY of the envelope tracking path when the partial resource blocks are allocated. As described above with reference to FIG. 5, sizes and positions of the resource blocks allocated in the channel band CB may be detected based on the allocation information of the resource blocks and the delay ET_DLY of the envelope tracking path may be determined in order to decrease the ACLR in the ACLR measurement band. Hereinafter, FIGS. 6A and 6B will be described with reference to FIGS. 1 and 5 and previously given description of FIGS. 6A and 6B will be omitted. It may be assumed that elements that are not described in detail herein are at least similar to corresponding elements that have already been described.

Referring to FIG. 6A, the lower ACLR measurement band MB_L and the upper ACLR measurement band MB_U may be provided to be adjacent to the channel band CB. The ACLR may be limited in the lower ACLR measurement band MB_L and the upper ACLR measurement band MB_U. As illustrated in FIG. 6A, when partial resource blocks PRa are allocated to be adjacent to a lower edge of the channel band CB, the controller 18 may adjust the delay ET_DLY of the envelope tracking path to increase the upper ACLR and to decrease the lower ACLR. Therefore, as illustrated in FIG. 6A, the increased upper ACLR may occur and the decreased lower ACLR may occur in the lower ACLR measurement band MB_L.

Referring to FIG. 6B, when partial resource blocks PRb are allocated to be adjacent to an upper edge of the channel band CB, the controller 18 may adjust the delay ET_DLY of the envelope tracking path to increase the lower ACLR and to decrease the upper ACLR. Therefore, as illustrated in FIG. 6B, the increased lower ACLR may occur and the decreased upper ACLR may occur in the upper ACLR measurement band MB_U.

The following [TABLE 2] represents a result of simulating the ACLR in a case in which all resource blocks are allocated (the left column) and a case in which partial resource blocks are allocated to be close to the lower edge of the channel band CB (the right column) in a bandwidth of 5 MHz, long term evolution (LTE), and 16 QAM.

TABLE 2

|  | ET_DLY for Full RB | Adjusted ET_DLY for partial RB |
| --- | --- | --- |
| Lower ACLR | −40.2 | −42.4 |
| Upper ACLR | −52 | −50.45 |

As confirmed through [TABLE 2], when the partial resource blocks are allocated and the delay ET_DLY of the envelope tracking path is adjusted, the lower ACLR may be decreased.

Figure 7:
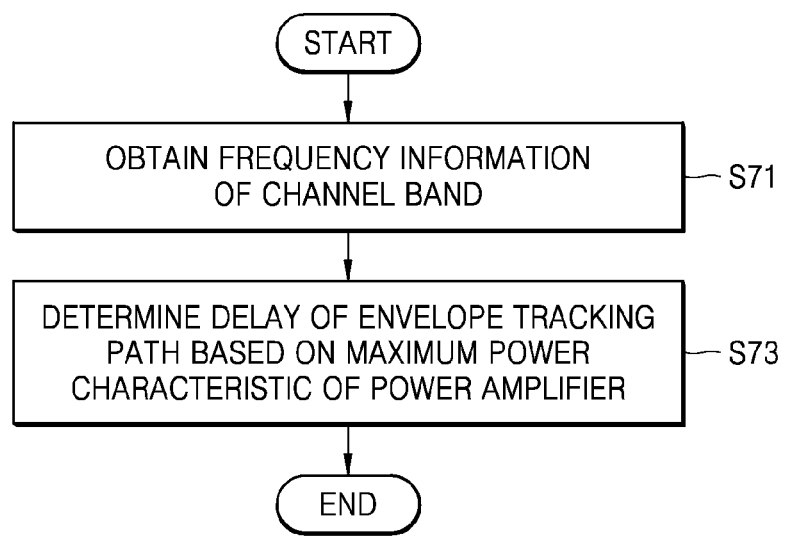
FIG. 7 is a flowchart illustrating a method of controlling spectral regrowth, according to an exemplary embodiment of the inventive concept.
Figure 8:
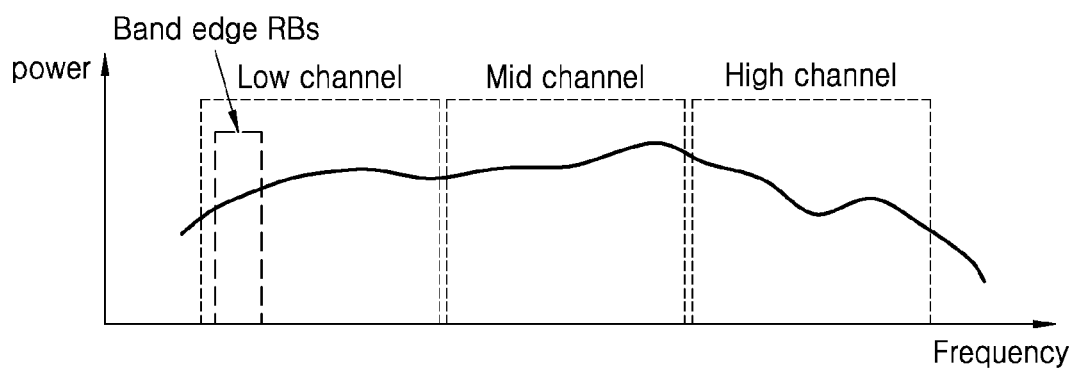
FIG. 8 is a graph illustrating an operation characteristic of a power amplifier in accordance with a frequency, according to an exemplary embodiment of the inventive concept.

FIG. 7 is a flowchart illustrating a method of controlling spectral regrowth, according to an exemplary embodiment of the inventive concept. FIG. 8 is a graph illustrating an operation characteristic of a power amplifier in accordance with a frequency, according to an exemplary embodiment of the inventive concept. For example, the flowchart of FIG. 7 illustrates a method of controlling spectral regrowth considering a frequency characteristic of a power amplifier and the graph of FIG. 8 illustrates the maximum power of a power amplifier in accordance with a frequency. Hereinafter, FIGS. 7 and 8 will be described with reference to FIG. 1.

Referring to FIG. 7, in operation S71, an operation of obtaining frequency information of the channel band CB may be performed. For example, the controller 18 may obtain the frequency information of the channel band CB from the transmission signal processor 11. The transmission signal processor 11 may provide a carrier frequency and a bandwidth etc. corresponding to the frequency information of the channel band CB to the controller 18 as some of the transmission parameters.

In operation S73, an operation of determining the delay ET_DLY of the envelope tracking path based on the maximum power characteristic of the power amplifier 15 may be performed. The power amplifier 15 may be in charge of no less than one band considering expenses, for example, an area, an exothermic, and power consumption. For example, as illustrated in FIG. 8, the power amplifier 15 may be in charge of a wide frequency band including a low channel, an intermediate channel, and a high channel. Toward an edge of the frequency band that the power amplifier 15 is in charge of, due to impedance matching, the maximum power of the power amplifier 15 may be reduced. When the transmission power is increased in order to compensate for the reduction in maximum power of the power amplifier 15, the spectral regrowth may increase. Therefore, when the power amplifier 15 has the low maximum power, it may be required to decrease the spectral regrowth.

In some embodiments, when the channel band CB corresponds to the edge of the frequency band that the power amplifier 15 is in charge of, the controller 18 may adjust the delay ET_DLY of the envelope tracking path. For example, the controller 18 may recognize a position of the channel band CB in the frequency spectrum and may determine whether the channel band CB corresponds to the edge of the frequency band that the power amplifier 15 is in charge of based on the frequency information of the channel band CB obtained in operation S71. When the channel band CB corresponds to the edge of the frequency band that the power amplifier 15 is in charge of, for example, for example, when the channel band CB including the resource blocks is provided at a lower edge of the frequency band that the power amplifier 15 is in charge of, as illustrated in FIG. 8, considering the reduced maximum power of the power amplifier 15, the delay ET_DLY of the envelope tracking path may be adjusted such that the spectral growth is suppressed.

Figure 9:
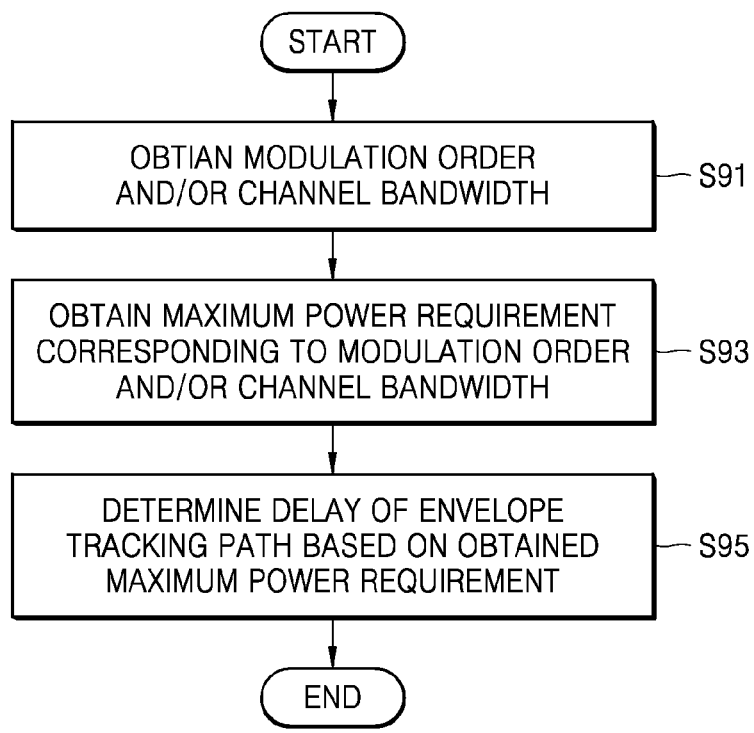
FIG. 9 is a flowchart illustrating a method of controlling spectral regrowth, according to an exemplary embodiment of the inventive concept.

FIG. 9 is a flowchart illustrating a method of controlling spectral regrowth, according to an exemplary embodiment of the inventive concept. For example, the flowchart of FIG. 9 illustrates the method of controlling the spectral regrowth by using some of the transmission parameters. In some embodiments, the method of FIG. 9 may be performed by the controller 18 of FIG. 1. Hereinafter, FIG. 9 will be described with reference to FIG. 1.

Referring to FIG. 9, in operation S91, an operation of obtaining a modulation order and/or a channel bandwidth may be performed. For example, the controller 18 may obtain the modulation order and/or the channel bandwidth from the transmission signal processor 11. The transmission signal processor 11 may provide the modulation order and/or the channel bandwidth as some of the transmission parameters to the controller 18.

In operation S93, an operation of obtaining the maximum power requirement corresponding to the modulation order and/or the channel bandwidth may be performed. For example, as described above with reference to [TABLE 1], the wireless communication system may define the MPR in accordance with the modulation order and/or the channel bandwidth. The controller 18 may obtain the maximum power requirement corresponding to the modulation order and/or the channel bandwidth obtained in operation S91 with reference to the MPR defined by the wireless communication system.

In operation S95, an operation of determining the delay ET_DLY of the envelope tracking path based on the obtained maximum power requirement may be performed. For example, the controller 18 may determine the delay ET_DLY of the envelope tracking path for controlling the spectral regrowth based on the maximum power requirement requested by the wireless communication system in accordance with the modulation order and/or the channel bandwidth, which is obtained in operation S93. In some embodiments, the controller 18 may determine the delay ET_DLY of the envelope tracking path such that a difference between the delay ET_DLY of the envelope tracking path and the delay TX_DLY of the transmission path is smallest by considering a range in which the spectral regrowth may be decreased in accordance with the maximum power requirement relaxed in accordance with the modulation order and/or the channel bandwidth.

Figure 10A:
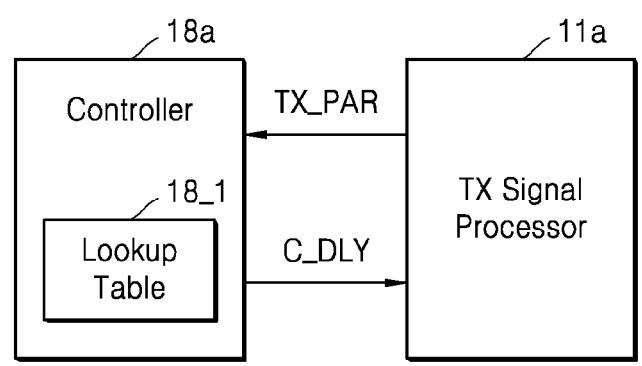
FIGS. 10A and 10B are block diagrams illustrating examples of a controller according to exemplary embodiments of the inventive concept.
Figure 10B:
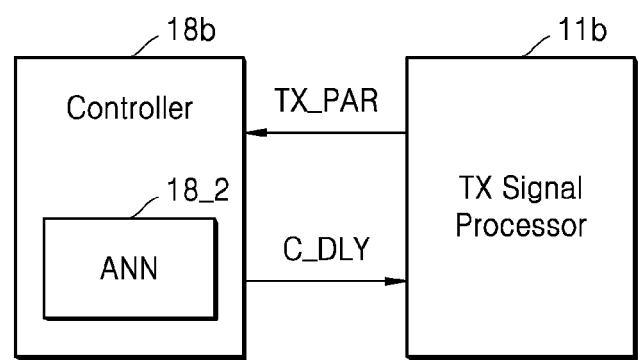

FIGS. 10A and 10B are block diagrams illustrating examples of a controller according to exemplary embodiments of the inventive concept. For example, the block diagrams of FIGS. 10A and 10B illustrate transmission signal processors 11a and 11b together with controllers 18a and 18b, respectively. Hereinafter, in FIGS. 10A and 10B, description previously given with reference to FIG. 1 is omitted. It may be assumed that elements that are not described in detail herein are at least similar to corresponding elements that have already been described.

Referring to FIG. 10A, the controller 18a may receive a transmission parameter TX_PAR from the transmission signal processor 11a and may provide a delay control signal C_DLY to the transmission signal processor 11a. As described above with reference to FIGS. 5, 7, and 9, some of the transmission parameters may be used for the controller 18a to determine the delay ET_DLY of the envelope tracking path and the controller 18a may generate the delay control signal C_DLY based on the delay ET_DLY of the envelope tracking path and may asymmetrically control the spectral regrowth by adjusting the delay ET_DLY of the envelope tracking path.

As illustrated in FIG. 10A, the controller 18a may include a lookup table 18_1 for storing a plurality of delays of the envelope tracking path. The lookup table 18_1 may output the delay ET_DLY of the envelope tracking path corresponding to the transmission parameter TX_PAR. For example, the lookup table 18_1 may receive at least one of the sizes and offsets of the allocated resource blocks, the modulation order, the channel bandwidth, and the frequency information of the channel band as some of the transmission parameters and may output the delay ET_DLY of the envelope tracking path corresponding to the received at least one transmission parameter. In some embodiments, the lookup table 18_1 may include non-volatile memory, as a non-limiting example, electrically erasable programmable read-only memory (EEPROM), flash memory, phase change random access memory (PRAM), resistance random access memory (RRAM), nano-floating gate memory (NFGM), polymer random access memory (PoRAM), magnetic random access memory (MRAM), and/or ferroelectric random access memory (FRAM).

Referring to FIG. 10B, the controller 18b may receive the transmission parameter TX_PAR from the transmission signal processor 11b and may provide the delay control signal C_DLY to the transmission signal processor 11b. The controller 18b may include an artificial neural network (ANN) 18_2. The ANN 18_2 may refer to a structure in which sets, in which artificial neurons (or neuron models) are connected to each other, are implemented. An artificial neuron may generate output data by performing simple operations on input data, and the output data may be transmitted to another artificial neuron. The ANN 18_2 may be in a state trained by a plurality of available transmission parameters and may output the delay ET_DLY of the envelope tracking path corresponding to the transmission parameter TX_PAR. For example, the ANN 18_2 may be in a state trained by a plurality of available allocations of the resource blocks.

In some embodiments, the ANN 18_2 may model the power amplifier 15 of FIG. 1. To model the power amplifier 15, as a non-limiting example, a multi-layer perceptron (MLP), a radial basis function artificial neural network (RBFNN), and a recurrent artificial neural network (RNN) may be used. The controller 18b may obtain an operation characteristic of the power amplifier 15 corresponding to the transmission parameter TX_PAR, for example, the maximum power or the ACLR from the ANN 18_2 and may determine the delay ET_DLY of the envelope tracking path based on the obtained characteristic of the power amplifier 15.

Figure 11:
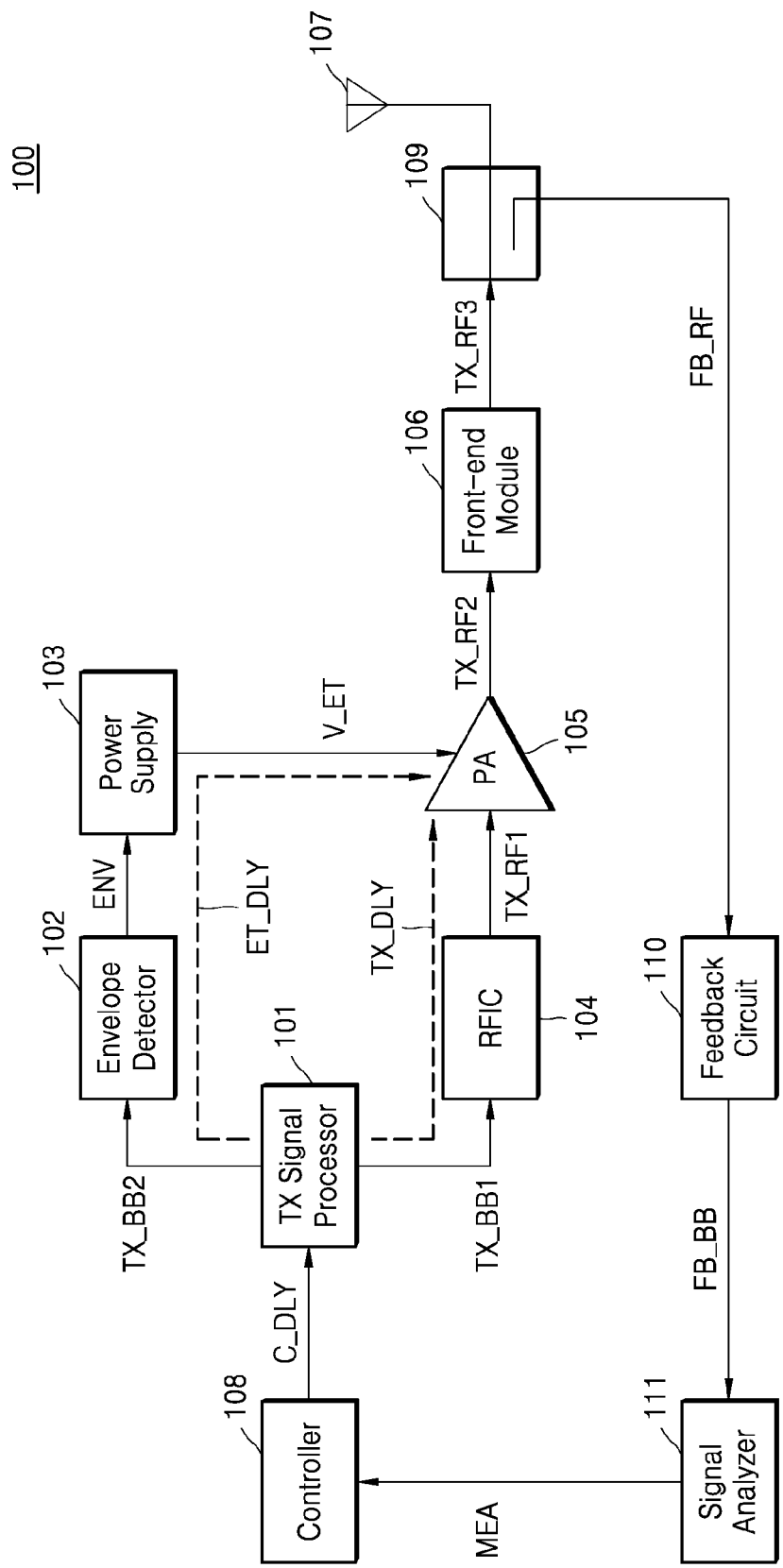
FIG. 11 is a block diagram schematically illustrating a wireless communication device according to an exemplary embodiment of the inventive concept.

FIG. 11 is a block diagram schematically illustrating a wireless communication device 100 according to an exemplary embodiment of the inventive concept. As illustrated in FIG. 11, the wireless communication device 100 may include a transmission signal processor 101, an envelope detector 102, a power supply 103, an RFIC 104, a power amplifier 105, a front-end module 106, an antenna 107, and a controller 108, like the wireless communication device 10 of FIG. 1, and may further include a coupler 109, a feedback circuit 110, and a signal analyzer 111. Hereinafter, in FIG. 11, description previously given with reference to FIG. 1 is omitted. It may be assumed that elements that are not described in detail herein are at least similar to corresponding elements that have already been described.

The transmission signal processor 101 may generate a first baseband transmission signal TX_BB1 and a second baseband transmission signal TX_BB2. The envelope detector 102 may generate an envelope signal ENV by processing the second baseband transmission signal TX_BB2. The power supply 103 generates a supply voltage V_ET in accordance with the envelope signal ENV and may provide the supply voltage V_ET to the power amplifier 105. The RFIC 104 may generate a first RF transmission signal TX_RF1 by processing the first baseband transmission signal TX_BB1. The power amplifier 105 may generate a second RF transmission signal TX_RF2 by amplifying the first RF transmission signal TX_RF1 in accordance with power provided by the supply voltage V_ET. The front-end module 106 may generate a third RF transmission signal TX_RF3 from the second RF transmission signal TX_RF2 and may provide the third RF transmission signal TX_RF3 to the coupler 109.

The coupler 109 may be connected to the front-end module 106 and the antenna 107 and may provide an RF feedback signal FB_RF coupled by the third RF transmission signal TX_RF3 provided by the front-end module 106 to the feedback circuit 110 in a transmission mode. The feedback circuit 110 may generate a baseband feedback signal FB_BB by processing the RF feedback signal FB_RF. The feedback circuit 110 may include a mixer, a filter, and an amplifier. In some embodiments, the feedback circuit 110 may be included in the RFIC 104. The signal analyzer 111 may receive the baseband feedback signal FB_BB and may provide a measurement signal MEA including measured information to the controller 108 by analyzing the baseband feedback signal FB_BB.

The controller 108 may determine the delay ET_DLY of the envelope tracking path based on information obtained by measuring a transmission signal and may thereby control spectral regrowth. In some embodiments, the signal analyzer 111 may measure an ACLR based on the baseband feedback signal FB_BB and may provide the measurement signal MEA including the measured ACLR to the controller 108. The controller 108 may compare the ACLR included in the measurement signal MEA with at least one threshold and may determine the delay ET_DLY of the envelope tracking path such that the ACLR satisfies requirement defined by the threshold. The controller 108 may generate the delay control signal C_DLY based on the determined delay ET_DLY of the envelope tracking path.

In some embodiments, the signal analyzer 111 may measure an EVM based on the baseband feedback signal FB_BB and may provide the measurement signal MEA including the measured EVM to the controller 108. As described above with reference to FIG. 4, when the difference between the delay TX_DLY of the transmission path and the delay ET_DLY of the envelope tracking path increases, the EVM may deteriorate. Therefore, the controller 108 may compare the EVM included in the measurement signal MEA with at least one threshold and may restrict a change in delay ET_DLY of the envelope tracking path such that the EVM satisfies the requirement defined by the threshold. An example of an operation of the controller 108 will be described later with reference to FIG. 12.

Figure 12:
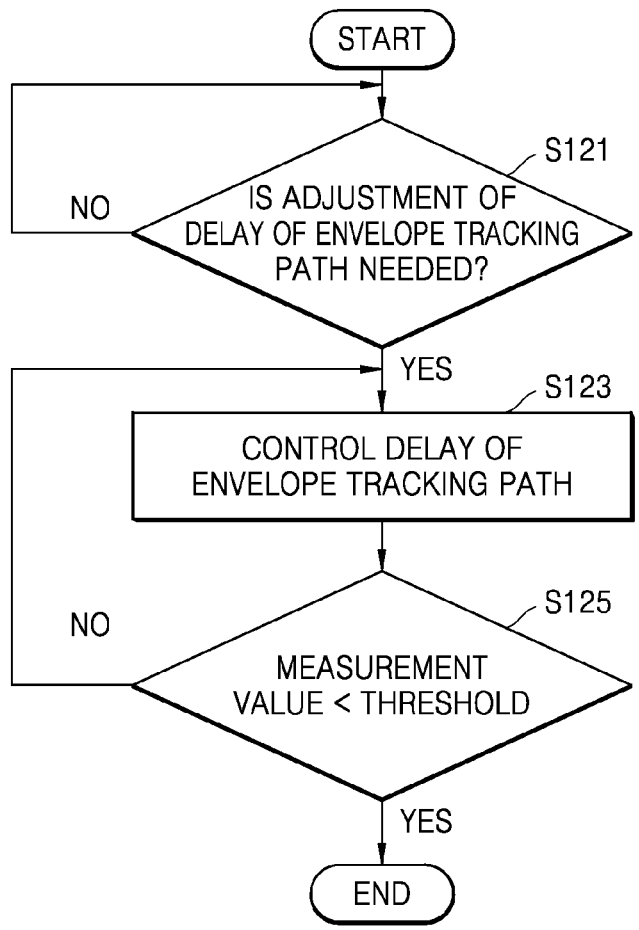
FIG. 12 is a flowchart illustrating a method of controlling spectral regrowth, according to an exemplary embodiment of the inventive concept.

FIG. 12 is a flowchart illustrating a method of controlling spectral regrowth, according to an exemplary embodiment of the inventive concept. In some embodiments, FIG. 12 may be performed by the controller 108 of FIG. 11. Hereinafter, FIG. 12 will be described with reference to FIG. 11.

In operation S121, an operation of determining whether to adjust the delay ET_DLY of the envelope tracking path may be performed. For example, the controller 108 may determine whether to adjust the delay ET_DLY of the envelope tracking path based on various factors. Examples of operation S121 will be described later with reference to FIGS. 13A to 13C. As illustrated in FIG. 12, when it is determined that the delay ET_DLY of the envelope tracking path is adjusted, operation S123 may be subsequently performed.

In operation S123, the operation of adjusting the delay ET_DLY of the envelope tracking path may be performed. For example, as described above with reference to the drawings, the controller 108 may determine the delay ET_DLY of the envelope tracking path such that a lower ACLR or an upper ACLR is decreased and may generate the delay control signal C_DLY in accordance with the determined delay ET_DLY of the envelope tracking path.

In operation S125, an operation of comparing the measurement value with the threshold may be performed. For example, the controller 108 may receive the measurement signal MEA generated by the signal analyzer 111 in a state in which the delay ET_DLY of the envelope tracking path is adjusted and may obtain at least one measurement value from the measurement signal MEA. As illustrated in FIG. 12, when the measurement value is no less than the threshold (or when the measurement value deviates from a normal range), operation S123 may be performed again and, when the measurement value is less than the threshold (or when the measurement value is included in a normal range), the method of FIG. 12 is terminated or may be repeated by performing operation S121 again.

In some embodiments, the controller 108 may obtain the ACLR from the measurement signal MEA, may adjust the delay ET_DLY of the envelope tracking path again in operation S123 in order to decrease the ACLR when the measured ACLR is no less than a first threshold, and may maintain the delay ET_DLY of the envelope tracking path when the measured ACLR is less than the first threshold. In addition, in some embodiments, the controller 108 may obtain the EVM from the measurement signal MEA, may adjust the delay ET_DLY of the envelope tracking path again in operation S123 in order to reduce the EMV when the measured EVM is no less than a second threshold, and may maintain the delay ET_DLY of the envelope tracking path when the measured EVM is less than the second threshold.

Figure 13A:
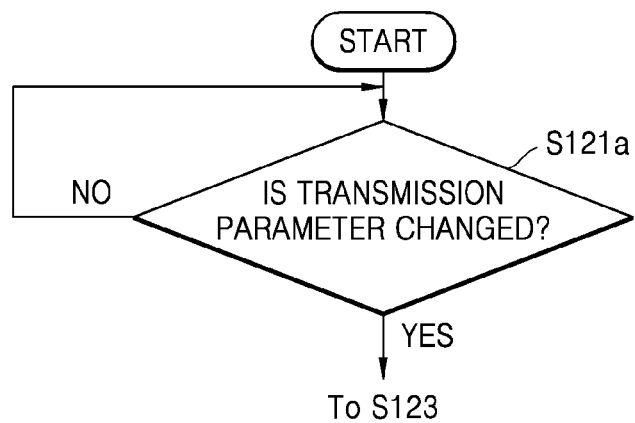
FIGS. 13A to 13C are flowcharts illustrating examples of operation S121 of FIG. 12 according to exemplary embodiments of the inventive concept.
Figure 13B:
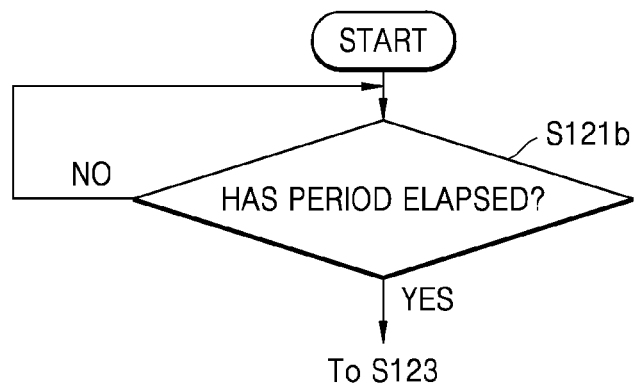
Figure 13C:
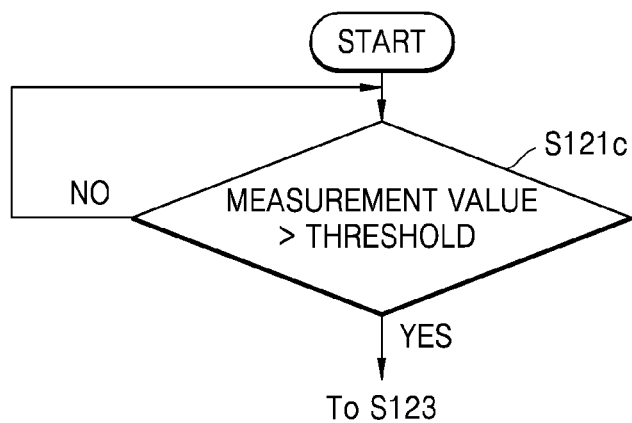

FIGS. 13A to 13C are flowcharts illustrating examples of operation S121 of FIG. 12 according to exemplary embodiments of the inventive concept. As described above with reference to FIG. 12, an operation of determining whether to adjust the delay ET_DLY of the envelope tracking path may be performed in operations S121a, S121b, and S121c of FIGS. 13A to 13C. In some embodiments, when at least one among the conditions illustrated in FIGS. 13A to 13C is satisfied, it may be determined that the delay ET_DLY of the envelope tracking path is controlled. In some embodiments, when no less than two conditions are all satisfied, it may be determined that the delay ET_DLY of the envelope tracking path is controlled. Hereinafter, FIGS. 13A to 13C will be described with reference to FIG. 11.

Referring to FIG. 13A, an operation of determining whether the transmission parameter is changed may be performed in operation S121a. For example, the controller 108 may receive the transmission parameter from the transmission signal processor 101 and may determine whether the at least one transmission parameter related to the spectral regrowth is changed. In some embodiments, the controller 108 may determine whether at least one of the sizes and offsets of the resource blocks, the modulation order, the channel bandwidth, and the frequency information of the channel band is changed. As illustrated in FIG. 13A, when the transmission parameter is changed, operation S123 of FIG. 12 may be subsequently performed.

Referring to FIG. 13B, an operation of determining whether a prescribed period has elapsed may be performed in operation S121b. For example, the controller 108 may include a timer (or a counter) and may determine whether to reach the prescribed period by using the timer expires. As illustrated in FIG. 13B, when it is determined to reach the prescribed period, operation S123 of FIG. 12 may be subsequently performed. Therefore, the delay ET_DLY of the envelope tracking path may be periodically adjusted.

Referring to FIG. 13C, in operation 121c, an operation of comparing the measurement value with the threshold may be performed. For example, in spite of the adjusted delay ET_DLY of the envelope tracking path, a characteristic of the transmission signal may deteriorate due to various factors. The controller 108 may receive the measurement signal MEA generated by the signal analyzer 111 and may obtain at least one measurement value from the measurement signal MEA. In some embodiments, the controller 108 may obtain the ACLR from the measurement signal MEA and may adjust the delay ET_DLY of the envelope tracking path in operation S123 of FIG. 12 when the ACLR is greater than a third threshold. In addition, in some embodiments, the controller 108 may obtain the EVM from the measurement signal MEA and may adjust the delay ET_DLY of the envelope tracking path in operation S123 of FIG. 12 when the EVM is greater than a fourth threshold.

Figure 14:
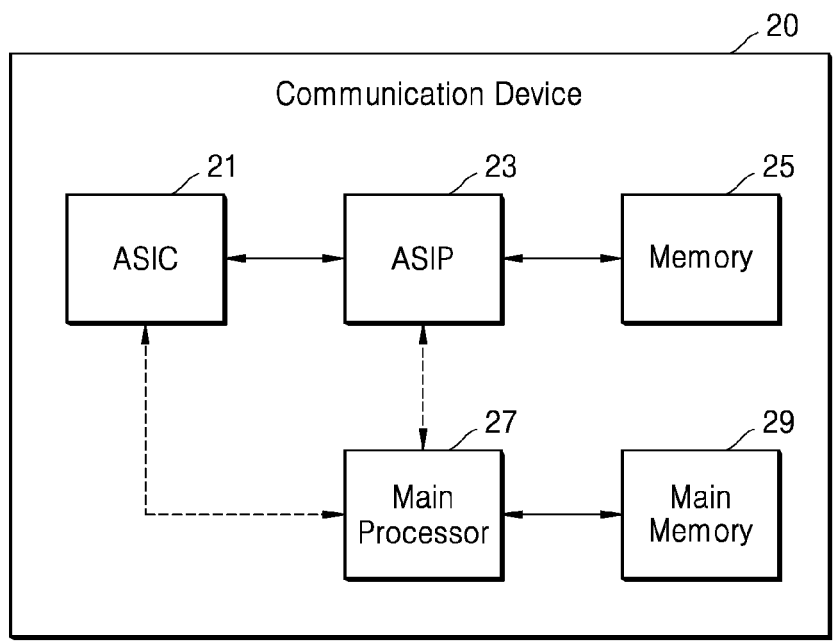
FIG. 14 is a block diagram illustrating an example of a communication device according to an exemplary embodiment of the inventive concept.

FIG. 14 is a block diagram illustrating an example of a communication device 20 according to an exemplary embodiment of the inventive concept. In some embodiments, the communication device 20 may perform at least partial operations of the transmission signal processor 11 and the controller 18 of FIG. 1 and the transmission signal processor 101, the controller 108, and the signal analyzer 111 of FIG. 11.

As illustrated in FIG. 14, the communication device 20 may include an application specific integrated circuit (ASIC) 21, an application specific instruction set processor (ASIP) 23, a memory 25, a main processor 27, and main memory 29. No less than two of the ASIC 21, the ASIP 23, and the main processor 27 may communicate with each other. In addition, no less than two of the ASIC 21, the ASIP 23, the memory 25, the main processor 27, and the main memory 29 may be built in a chip.

The ASIP 23 as an integrated circuit customized for a particular purpose may support an instruction set only for a particular application and may execute instructions included in the instruction set. The memory 25 may communicate with the ASIP 23 and may store a plurality of instructions executed by the ASIP 23 as a non-temporary storage device. For example, the memory 25 may include arbitrary memory that the ASIP 23 may access such as random access memory (RAM), read only memory (ROM), tape, a magnetic disk, an optical disk, volatile memory, non-volatile memory, or a combination of the above materials as a non-limiting example.

The main processor 27 may control the communication device 20 by executing the plurality of commands. For example, the main processor 27 may control the ASIC 21 and the ASIP 23 and may process data received through a wireless communication network or an input of a user for the communication device 20. The main memory 29 may communicate with the main processor 27 and may store the plurality of instructions executed by the main processor 27 as a non-temporary storage device. For example, the main memory 29 may include arbitrary memory that the main processor 27 may access such as RAM, ROM, tape, a magnetic disk, an optical disk, a volatile memory, a non-volatile memory, or a combination of the above materials as a non-limiting example.

A method of controlling the spectral regrowth may be performed by at least one of components included in the communication device 20 of FIG. 14. In some embodiments, an operation of the controller 18 of FIG. 1 or the controller 108 of FIG. 11 may be implemented by the plurality of instructions stored in the memory 25 and the ASIP 23 may perform at least one of operations of a method of controlling the spectral regrowth by executing the plurality of instructions stored in the memory 25. In some embodiments, at least one of the operations of the method of controlling the spectral regrowth may be performed by a hardware block designed by logic synthesis and the hardware block may be included in the ASIC 21. In some embodiments, at least one of the operations of the method of controlling the spectral regrowth may be implemented by the plurality of instructions stored in the main memory 29 and the main processor 27 may perform at least one of the operations of the method of controlling the spectral regrowth by executing the plurality of instructions stored in the main memory 29.

While the inventive concept has been particularly shown and described with reference to embodiments thereof, it will be understood that various changes in form and details may be made therein without departing from the spirit and scope of the following claims.

What is claimed is:

1. A device for controlling spectral regrowth, the device comprising:
   a transmission signal processor configured to generate a baseband transmission signal; and
   a controller configured to adjust a delay of an envelope tracking path that provides a supply voltage to an envelope tracking power amplifier included in a transmission path that generates a radio frequency (RF) transmission signal from the base band transmission signal,
   wherein the controller is configured to obtain allocation information of resource blocks included in the RF transmission signal and frequency information including carrier frequency of a channel band of the RF transmission signal from the transmission signal processor, and
   wherein the controller is configured to determine the delay of the envelope tracking path based on the allocation information and a position of the channel band in a frequency spectrum defined by a maximum power characteristic of the envelope tracking power amplifier.

2. The device of claim 1,
   wherein the allocation information comprises offset information that represents positions of resource blocks allocated in a channel band, and
   wherein the controller is configured to determine the delay of the envelope tracking path such that an upper adjacent channel leakage ratio (ACLR) and a lower ACLR of the RF transmission signal are asymmetrically generated based on the offset information.

3. The device of claim 2, wherein the controller is configured to detect an edge of the channel band adjacent to the allocated resource blocks based on the offset information and to determine the delay of the envelope tracking path so as to decrease the upper ACLR or the lower ACLR adjacent to the detected edge.

4. The device of claim 2,
   wherein the allocation information comprises size information that includes sizes of the allocated resource blocks, and
   wherein the controller is configured to determine the delay of the envelope tracking path based on the size information.

5. The device of claim 2, wherein the controller is configured to adjust the delay of the envelope tracking path such that the spectral growth is suppressed when the channel band is provided near either edge of the frequency spectrum.

6. The device of claim 2, wherein the controller is configured to obtain a modulation order and/or a bandwidth of the RF transmission signal from the transmission signal processor and to determine the delay of the envelope tracking path based on the modulation order and/or the bandwidth of the RF transmission signal.

7. The device of claim 2, wherein the controller is configured to determine the delay of the envelope tracking path such that the upper ACLR and the lower ACLR are symmetrically generated when all resource blocks are allocated in the channel band.

8. The device of claim 1, wherein the controller comprises a lookup table that stores the delay of the envelope tracking path corresponding to the allocation information of the resource blocks.

9. The device of claim 1, wherein the controller comprises an artificial neural network (ANN) trained by a plurality of available allocations of resource blocks and ANN is configured to output the delay of the envelope tracking path.

10. A device of controlling spectral regrowth, the device comprising:
    a transmission signal processor configured to generate a baseband transmission signal; and
    a controller configured to adjust a delay of an envelope tracking path that provides a supply voltage to an envelope tracking power amplifier included in a transmission path that generates a radio frequency (RF) transmission signal from the based band transmission signal,
    wherein the controller is configured to obtain adjacent channel leakage ratio (ACLR) measurement information generated by measuring an ACLR of a channel band of the RF transmission signal and configured to adjust the delay of the envelope tracking path based on the ACLR measurement information,
    wherein the ACLR measurement information comprises an upper ACLR and a lower ACLR, and
    wherein the controller is configured to adjust the delay of the envelope tracking path such that the upper ACLR and the lower ACLR of the RF transmission signal are asymmetrically generated based on the ACLR measurement information and an ACLR threshold.

11. The device of claim 10, wherein the controller is configured to obtain error vector magnitude (EVM) measurement information generated by measuring an EVM of the RF transmission signal and to adjust the delay of the envelope tracking path based on the EVM measurement information and an EVM threshold.

12. The device of claim 10, wherein the controller is configured to determine, based on information provided by the transmission signal processor, whether at least one of an allocation of resource blocks included in the RF transmission signal, a frequency band, a modulation order, and a bandwidth of the RF transmission signal is changed and to determine the delay of the envelope tracking path when at least one of the allocation of resource blocks, the frequency band, the modulation order, and the bandwidth of the RF transmission signal is changed.

13. The device of claim 10, wherein the controller is configured to determine the delay of the envelope tracking path at predefined periods.

14. The device of claim 10, wherein the controller is configured to determine that the delay of the envelope tracking path occurs when the measured ACLR is greater than a ACLR threshold.

15. The device of claim 10, wherein the controller is configured to obtain new ACLR measurement information corresponding to the adjusted delay of the envelope tracking path and to determine whether the delay of the envelope tracking path is further adjusted, based on the new ACLR measurement information.

16. A device for controlling spectral regrowth, the device comprising:
   a transmission signal processor configured to generate a baseband transmission signal; and
   a controller configured to adjust a delay of an envelope tracking path that provides a supply voltage to an envelope tracking power amplifier included in a transmission path that generates a radio frequency (RF) transmission signal from the base band transmission signal,
   wherein the controller is configured to determine the delay of the envelope tracking path such that an upper adjacent channel leakage ratio (ACLR) and a lower ACLR of the RF transmission signal are asymmetrically generated, and
   wherein the controller is configured to determine the delay of the envelope tracking path within a range except ranges in which both the upper ACLR and the lower ACLR increase or decrease in accordance with a change in the delay of the envelope tracking path.

17. The device of claim 16, wherein the controller is configured to determine the delay of the envelope tracking path so as to decrease the upper ACLR or the lower ACLR adjacent to an ACLR measurement band of the RF transmission signal.

18. The device of claim 16, wherein the controller is configured to determine the delay of the envelope tracking path such that both the upper ACLR and the lower ACLR of the RF transmission signal are symmetrically generated to decrease both the upper ACLR and the lower ACLR of the channel band of the RF transmission signal.

* * * * *